United States Patent [19]

Eguchi et al.

[11] 4,356,567
[45] Oct. 26, 1982

[54] RADIO RECEIVER WITH BANDWIDTH SWITCHING

[75] Inventors: Yoichi Eguchi; Takeshi Yokota, both of Tokyo, Japan

[73] Assignee: Pioneer Electronic Corporation, Tokyo, Japan

[21] Appl. No.: 919,648

[22] Filed: Jun. 28, 1978

[30] Foreign Application Priority Data

Jun. 28, 1977 [JP] Japan .................................. 52-76771
Jun. 28, 1977 [JP] Japan .................................. 52-76772

[51] Int. Cl.³ .............................................. H04B 1/16
[52] U.S. Cl. .................................. 455/177; 455/197; 455/200; 455/205; 455/266
[58] Field of Search ............... 358/904; 455/205, 208, 455/214, 266, 200, 179, 170, 176, 177, 197

[56] References Cited

U.S. PATENT DOCUMENTS

| | | | |
|---|---|---|---|
| 2,927,997 | 3/1960 | Day | 325/427 |
| 2,969,459 | 1/1961 | Hern | 325/427 |
| 3,649,919 | 3/1972 | Fridman et al. | 325/346 |
| 3,827,387 | 3/1975 | Banach | 325/427 |
| 4,030,036 | 6/1977 | Kusano | 325/344 |
| 4,124,817 | 11/1978 | Takahashi | 325/344 |

FOREIGN PATENT DOCUMENTS 50-158209 12/1975 Japan .
52-63311 5/1977 Japan .
52-150636 5/1977 Japan .

*Primary Examiner*—Jin F. Ng
*Attorney, Agent, or Firm*—Sughrue, Mion, Zinn, Macpeak & Seas

[57] ABSTRACT

An automatic IF amplifier band width switching circuit is provided in which band width is switched from broad to narrow in response to either high frequency noise or a predetermined magnitude of interference voltage when the FM detection output is at zero volts. The switching signal may be combined with a hum signal from the tuning knob so that only switching in one direction is possible after tuning is complete.

6 Claims, 7 Drawing Figures

RADIO RECEIVER WITH BANDWIDTH SWITCHING

BACKGROUND OF THE INVENTION

This invention relates to radio receivers having two intermediate frequency amplifiers different in band characteristic, and more particularly to a radio receiver having a means which automatically switches such two intermediate frequency amplifiers according to signal reception states.

In general, in an FM radio receiver, the band width of the intermediate frequency amplifiers (hereinafter referred to as "as IF amplifier" when applicable) is narrowed to increase its selectivity against the occurrence of an interference signal such as from a near-by station. This method is advantageous in that the distortion of the demodulation signal is increased to lower the tonal quality. If the band width of the intermediate frequency amplifier is broadened, it is advantageous in that the distortion is decreased and the tonal quality is improved; however, it is disadvantageous in that the receiver is liable to suffer from radio interference.

In order to meet these contradictory conditions, it can be considered that an IF amplifier having two different band characteristics, namely a broad band characteristic and a narrow band characteristic, is provided, and the two band characteristics are manually or automatically switched according to signal receiving conditions. However, the manual switching is not practical because the switching operation must be carried out after the user determines the presence or absence of an interference signal. Therefore, the automatic switching in which the band widths are automatically switched in response to the detection of an interference signal is superior to the manual switching.

A conventional FM radio receiver having this automatic IF band width switching means is shown in FIG. 1.

The FM radio receiver comprises a front end 1, a broad band IF amplifier 2a, a narrow band IF amplifier 2b, FM detectors 3a and 3b for detecting the broad band IF signal and the narrow band IF signal, respectively, and a change-over switch 4. The change-over switch 4 is switched by a control signal so that only one of the output signals of the detectors 3a and 3b is applied to an MPX demodulator. In FIG. 1, reference numerals 6 and 7 designate respectively a high-pass filter and an AM detector for providing the control signal. An interference signal such as a beat distortion signal included in the FM detection output of a broad band system is detected and converted into a DC signal, and the switching circuit 4 is switched to the narrow band side b for the period during which the control signal is produced while it is switched to the broad band side a in a normal signal receiving state when no interference signal is produced.

When an interference singal is mixed with the FM signal applied to the antenna, harmonic beat components between thIF detectors 3a and 3b. Out of the harmonic beat components, the beat component occurring on the broad band side a is detected by the high-pass filter 6 and is converted into a DC signal by the AM detector 7, by which the change-over switch 4 is switched over to the narrow band side b. For the band switching control signal of the change-over switch 4, only the high frequency noise component is detected by using the high-pass filter; however, when the signal of a high electric field strength station appears near the frequency of the desired station, the FM detection output is as indicated in FIG. 7. In other words, when the signal of an interference station (b) having a tuning frequency $f_1$ and an electric field strength greater than that of a desired station (a) appears near the signal of the desired station having a tuning frequency $f_0$, the change-over switch 4 maintains the broad band signal reception state; that is, it is not switched over to the narrow band side. Accordingly, it is impossible to receive the signal of the desired station (a) because the signal of the desired station (a) is drowned by the signal of the interference station.

The frequency response characteristic of the high-pass filter 6 is flat and, therefore, the control is effected merely by the electric field strength of the interference signal regardless of the difference in frequency between the desired signal and the interference signal, and the tonal quality of the received signal is not uniform. A characteristic of interference signal level vs. high frequency noise, and a characteristic of difference in frequency between the signal of a desired station and an interference signal vs. high frequency noise are as indicated in FIGS. 4 and 5, respectively. Referring to FIG. 4, when the level of an interference signal having a strong field strength exceeds a predetermined value, no high frequency noise is produced and accordingly the band control signal is provided. Therefore, the change-over switch 4 is switched over to the broad band side a. Referring to FIG. 5, when the interference signal is sufficiently different from the signal of the desired station, the high frequency noise is decreased. Accordingly, although the quality of the desired signal is lowered, the received signal in the broad band IF system is outputted. Furthermore, sometimes an interference signal is instantaneously and repeatedly caused to occur depending on signal receiving conditions. In this case, the switching circuit 4 frequently carries out its switching operation within a short period of time, which will give an unpleasant sound to the user.

SUMMARY OF THE INVENTION

Accordingly, an object of this invention is to eliminate the above-described drawbacks. More specifically, an object of the invention is to provide a radio receiver having an automatic IF amplifier band width switching circuit in which the IF band widths are switched according to signal receiving conditions during a station selecting operation, and after the station selecting operation only a predetermined switching operation according to signal receiving condition is effected.

Briefly, this is accomplished by providing a zero volt switch operating in parallel with the high frequency AM noise detector to change the band selection switch to narrow band when a predetermined magnitude of interference signal at the desired tuning frequency is detected. By combining the outputs of the AM detector and zero volt switch with a hum signal generated when the tuning knob is touched, the switching of the band selecting switch in either direction is possible during tuning but is only possible in one direction when no hum signal is generated, thus preventing constant switchover and the accompanying unpleasant sound.

DETAILED DESCRIPTION OF THE INVENTION

Figure 1:
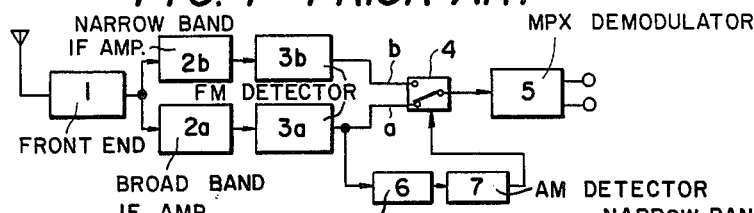
FIG. 1 is a block diagram of a conventional radio receiver.

Embodiments of this invention will now be described with reference to the accompanying drawings, in which those elements which have been previously described with reference to FIG. 1 have therefore been similarly numbered.

Figure 2:
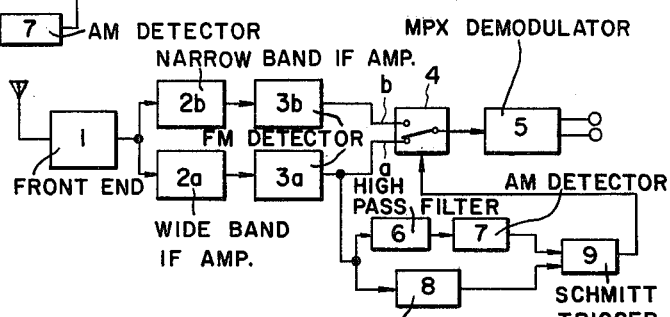
FIG. 2 is a block diagram of a receiver according to the present invention.
Figure 4:
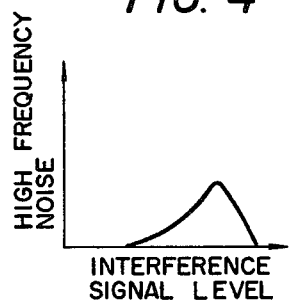
FIG. 4 is a typical graph of interference signal level vs. high frequency noise.
Figure 7:
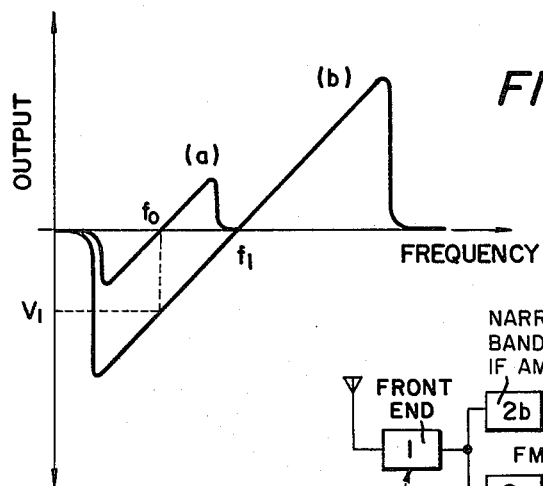
FIG. 7 is a voltage vs. frequency plot showing the relationship between a desired station signal (a) and an interference signal (b).

A first embodiment of the invention is shown in FIG. 2. In this embodiment, a broad band FM detector 3a is connected to an AM detector 7 and a high-pass filter 6 for detecting a high frequency noise component and to a zero volt switch 8 which operates to detect an interference signal level at the tuning frequency of a desired station to output a voltage. The outputs of the AM detector 7 and the zero volt switch 8 are applied to a Schmitt trigger circuit 9. When at least one of the outputs is provided, a control signal is provided by the Schmitt trigger circuit 9, so as to switch a change-over switch 4 to a narrow band side b. In the case where there is a high electric field strength station (b) at a near-by frequency as indicated in FIG. 7, no output is provided by the AM detector because of the "S" curve characteristic which is the output of the FM detector 3a; however, when the zero volt switch 8 detects the tuning frequency $f_0$ of a desired station, and the output $V_1$ of the interference signal (b) obtained when the FM detection output is at zero volts is higher (or lower) than a predetermined level, the switch 8 provides its output to operate the Schmitt trigger circuit 9, as a result of which the change-over switch 4 is switched to the narrow band side b by the control signal.

Figure 3:
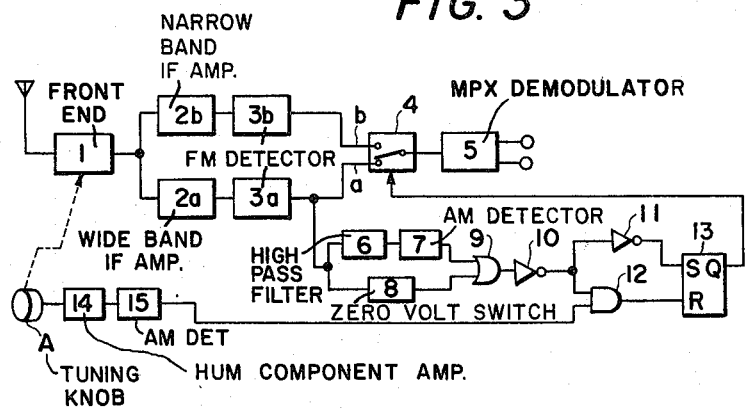
FIG. 3 is a block diagram of a second embodiment of a receiver according to the present invention.

In a second embodiment shown in FIG. 3, the outputs of the AM detector 7 and the zero volt switch 8 shown in FIG. 2 are connected to an OR circuit 9. The output of the OR circuit 9 is connected through a NOT circuit 10 to a NOT circuit 11 and to one input terminal of an AND circuit 12. The output of the NOT circuit 11 is connected to the set terminal S of an RS flip-flop 13. The other input terminal of the AND circuit 12 is connected to a hum component amplifier 14 and an AM detector 15, and the output of the AND circuit 12 is connected to the reset terminal R of the flip-flop 13. Switching the change-over switch 4 is controlled by the output Q of the flip-flop 13. Reference character A is intended to designate a tuning knob, which, in a contact state, generates a hum component which is applied to the hum component amplifier 14.

Assuming that in each of the circuits described above, a state that it provides an output is "1", while a state that it does not produce an output is "0", the operation of the circuit will be described. In a station selecting operation, the tuning knob A is in the contact state. Therefore, the AM detector 15 provides a DC output from the hum component, and therefore the state "1" is obtained. If, in this case, the signal receiving state is good, or free from noises or interference signals, both of the outputs of the AM detector 7 and the zero volt switch 8 are at "0", the output of the OR circuit 9 is at "0", and the output of the NOT circuit 10 is at "1". Accordingly, the output of the AND circuit 12 is raised to "1", and this "1" output is applied to the reset terminal R of the flip-flop 13. As a result, the output Q of the flip-flop 13 is changed to "0", and the change-over switch 4 is switched to the broad band side a. Thus, the signal reception is carried out by the broad band IF amplifier.

On the other hand, when an interference signal is detected from the reception signal, at least one of the outputs of the AM detector 7 and the zero volt switch 8 is raised to "1", as a result of which the output of the OR circuit 9 is raised to "1", while the output of the NOT circuit 10 is changed to "0". Accordingly, the output of the AND circuit 12 is switched to "0", and the output "1" is applied to the set terminal S of the flip-flop 13. Therefore, the output Q of the flip-flop 13 is raised to "1" to provide the control signal, whereby the change-over switch 4 is switched to the narrow band side b. Thus, the narrow band signal reception is carried out.

After completion of the station selecting operation, the tuning knob A is not in the contact state. Therefore, the output of the AM detector 15 is switched to "0", and the output of the AND circuit 12 is maintained at "0" at all times, as a result of which the flip-flop 13 is placed in a state that is not reset. Accordingly, the change-over switch 4 is maintained switched to the narrow band side b as a result of the detection of an interference signal during the station selecting operation; however, even if the output of the OR circuit 9 is changed to "0" because of the good signal receiving state after the completion of the station selection operation, the output of the flip-flop 13 is still at "1", and therefore the change-over switch 4 is not switched to the broad band side a, that is, it is maintained switched to the narrow band side b for signal reception. In contrast, in the case where the broad band signal reception is effected during the station selecting operation and an interference signal is detected after the completion of the station selecting operation, the output of the OR circuit 9 is raised to "1" and the output of the NOT circuit 11 is also raised to "1". Therefore, the output "1" is applied to the set terminal S of the flip-flop 13, as a result of which the output Q therefore is changed from "0" to "1" and the change-over switch 4 is therefore switched from the broad band side a to the narrow band side b.

When it is required to change the narrow band signal reception over to the broad band signal reception after a station selecting operation, the output of the AM detector 15 is raised to "1" by touching the tuning knob A and an interference signal is produced; however, if the signal receiving state is good, the change-over switch 4 is switched to the broad band side a through the above-described operation.

In the above-described embodiment, the change-over switch is switched only from the broad band side to the narrow band side after a station selecting operation; however, with a circuitry similar to that of the embodiment, the change-over switch can be switched from the narrow band side to the broad band side.

Figures 5, 6:
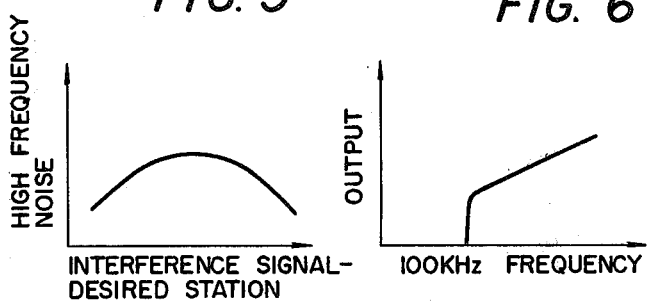
FIG. 5 is a typical graph of difference in frequency between an interference signaL and a desired station vs. high frequency noise.
FIG. 6 is a graph of the frequency response of the high pass filter used in the receiver according to the present invention.

The characteristic of the high-pass filter 6 employed in this invention is as shown in FIG. 6, in which noise components whose frequencies are higher than 100 KHz are detected, and its output is increased as the frequency is increased. Therefore, even if the frequency of an interference signal is much different from the frequency of a desired station, the high-pass filter 6 can detect the noise component to operate the switching control circuit, as a result of which the change-over switch 4 can be switched to the narrow band side b.

As is apparent from the above description, according to the invention, even if there appears a low electric field station whose frequency is close to the frequency of a desired station, the change-over switch is switched over to the narrow band side. Therefore, the desired station can be clearly selected. In addition, erroneous switching operation can be prevented. Furthermore, by giving a frequency response characteristic to the noise component detecting high-pass filter, it is possible to maintain the tonal quality of a reception signal unchanged, which leads to a satisfactory signal reception at all times. Still further, during the station selecting operation, the IF bands are selectively switched by the control signal according to the signal receiving state and after the station selecting operation the band selection is effected only in one way. In this way, the click sound, which may be caused when the reception band is switched, can be eliminated; that is, a satisfactory signal reception state can be maintained at all times without giving an unpleasant sound to the user.

What is claimed is:

1. A radio receiver, comprising:
a first intermediate frequency amplifier having a broad band characteristic;
a first detector having a tuning frequency for detecting the output of said first intermediate frequency amplifier;
a second intermediate frequency amplifier having a narrow band characteristic;
a second detector having a tuning frequency for detecting the output of said second intermediate frequency amplifier;
an interference signal detecting means for providing an output when the magnitude of a noise component such as an interference distortion signal or a pulsating noise signal contained in a demodulation signal of said first detector exceeds a predetermined magnitude;
a zero volt switch which detects the level of a near-by interference signal present in the vicinity of the tuning frequency of said first or second detector and provide an output when the level of the near-by interference signal is at a predetermined level;
a control signal generating means for generating a control signal in response to either of the outputs of said interference signal detecting means and zero volt switch; and
switching means controlled by the presence or absence of said control signal to switch between a first position in which it passes the demodulation signal of said first detector and a second position in which it passes the demodulation signal of said second detector.

2. A radio receiver as defined in claim 1, further comprising a station selection detecting means for detecting the fact that a station selecting operation is being carried out and providing an output signal as an additional input signal to said control signal generating means, said control signal generating means providing a control signal in response to the outputs of either of said interference signal detecting means and zero volt switch during station selection and is capable of switching said switching means in only one direction after completion of station selection.

3. A radio receiver as defined in claim 2, wherein said control signal generating means is only capable of switching said switch means from said first position to said second position after station selection is complete.

4. A radio receiver as defined in claim 3 wherein said station selection detecting means comprises means for detecting a user's touch of a tuning knob of said radio receiver.

5. The radio receiver as defined in claim 4 wherein said switching means comprises flip-flop means, said control signal being coupled to a first of SET and RESET inputs of said flip-flop means and an output of said station selection detecting means being coupled to a second of said SET and RESET inputs of said flip-flop.

6. The radio receiver as defined in claim 5 wherein said means for detecting a user's touch inhibits operation of said flip-flop means when said station selection is complete.

* * * * *